United States Patent [19]
Weglein

[11] B 3,983,517
[45] Sept. 28, 1976

[54] SURFACE ACOUSTIC WAVE MULTI-CHANNEL FILTER

[75] Inventor: Rolf D. Weglein, Los Angeles, Calif.

[73] Assignee: Hughes Aircraft Company, Culver City, Calif.

[22] Filed: Dec. 20, 1974

[21] Appl. No.: 534,991

[44] Published under the second Trial Voluntary Protest Program on January 27, 1976 as document No. B 534,991.

[52] U.S. Cl. ................................. 333/72; 310/8.1; 310/8.2; 310/9.8; 333/1; 333/72
[51] Int. Cl.[2] ..................... H03H 9/26; H03H 9/30; H03H 9/32; H01L 41/08
[58] Field of Search .................. 333/72, 30 R; 310/8, 310/8.1, 9.7, 9.8, 8.2

[56] References Cited
UNITED STATES PATENTS

| | | | |
|---|---|---|---|
| 3,568,102 | 3/1971 | Tseng | 333/30 R |
| 3,753,164 | 8/1973 | De Vries | 333/30 R |

OTHER PUBLICATIONS

Williamson et al., "The Use of Surface–Elastic–Wave Reflection Gratings in Large Time–Bandwidth Pulse–Compression Filters," in IEEE Trans on Microwave Theory and Techniques, vol. MTT 21, No. 4, Apr. 1973, pp. 195–199.

*Primary Examiner*—Eli Lieberman
*Assistant Examiner*—Marvin Nussbaum
*Attorney, Agent, or Firm*—John Holtrichter, Jr.; W. H. MacAllister

[57] ABSTRACT

A surface acoustic wave filter including a relatively broad band input transducer that launches acoustic energy along a first path, at least one frequency-selective periodic grating filter disposed in the first path and adapted to reflect the energy incident thereon along an intermediate path, at least one frequency selective periodic grating filter disposed in the intermediate path and adapted to reflect the energy incident thereon along an output path to an associated output transducer.

7 Claims, 9 Drawing Figures

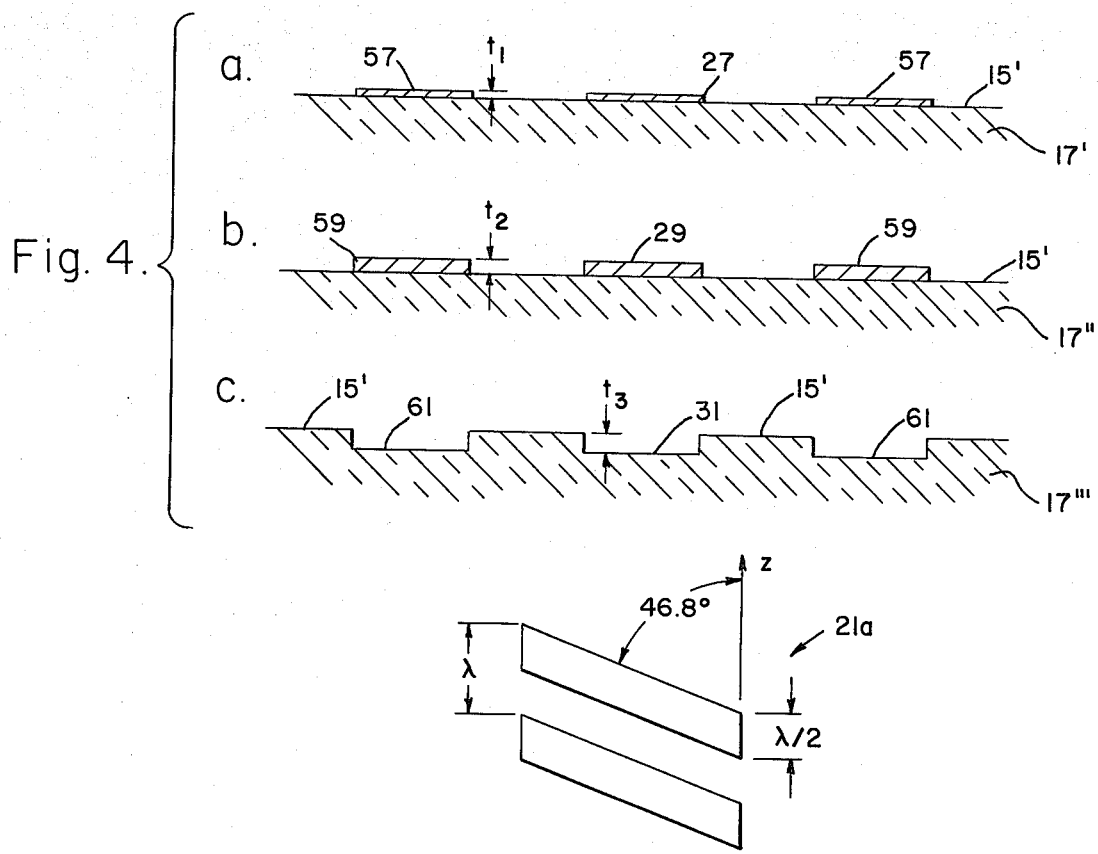
Fig. 4.
Fig. 2.
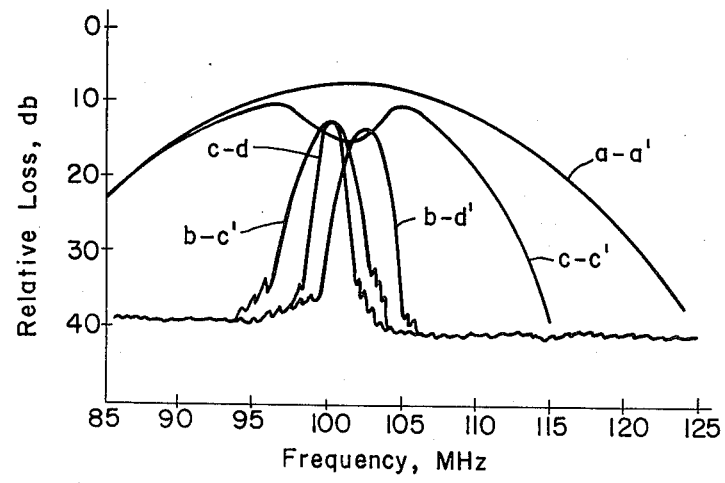
Fig. 7.

SURFACE ACOUSTIC WAVE MULTI-CHANNEL FILTER

BACKGROUND OF THE INVENTION:

The background of the invention will be set forth in two parts.

FIELD OF THE INVENTION

This invention relates to surface acoustic wave devices and more particularly to a channelizing filter, or contiguous filter bank, containing one or more channels.

DESCRIPTION OF THE PRIOR ART

In the past, the usual manner used to provide a multi-channel filter was to design a broad band input power divider, to which separate narrow-band lumped, or distributed element filters were coupled.

Another well-known technique is to use the interdigital surface acoustic wave transducer as a means for realizing a variety of band-pass filter functions. The pass band is inversely proportional to the number of electrode pairs in the transducer, and therefore a small fractional bandwidth is obtained by proportionately increasing the structure lengths. On high-coupling-coefficient materials, such as y-z lithium niobate, the desired in-band characteristics are substantially degraded by the rather large inherent impedance discontinuities, and the use of double electrodes has been proposed and demonstrated as a means of removing distortion. Also, the use of the periodically thinned arrays to produce very narrow pass bands has been advocated. This technique has been described in an article by P. Hartman, entitled "Narrow-Bandwidth Rayleigh-Wave Filters," in Electronics Letters, 1971, Vol. 7, pages 674 and 675. It should be noted that there is also present a fabrication problem in that the double-electrode configuration requires electrode widths one-half that of a single electrode transducer, which has electrodes only one-quarter wavelength wide.

Taking still another approach, the present invention utilizes an improvement in the periodic reflecting grating technique described generally in an article entitled "Elastic Surface Waves on Free Surfaces and Metallized Surfaces on CdS, ZnO and PZT-4," by C. C. Tseng, in Journal of Applied Physics, Vol. 38, No. 11, October 1967.

Some advantages of the use of periodic grating arrays are their insensitivity to defects and the fact that they do not transmit transducer-generated spurious signals (bulk waves), as pointed out in an article entitled "Large-Time-Bandwidth-Product Surface-Wave Pulse Compressor Employing Relative Gratings," in Electronics Letters, Vol. 8, No. 16, Aug. 10, 1972, by R. C. Williamson. The reflective-array compressor with its symmetry placed mirror-image grating described in this article, however, does not provide a frequency selection with high design flexibility. The same can be said of the surface wave acoustic delay line described in U.S. Pat. No. 3,568,102, with its relatively inflexible band width and shape factors.

Another significant advantage of the new technique is that the electrode widths of the gratings are one-half wavelength and therefore fabrication may be accomplished in a single step by photo-lithography (UHF range), or electron-beam lithography (microwave range).

SUMMARY OF THE INVENTION

In view of the foregoing factors and conditions charactersitic of the prior art, it is a primary object of the present invention to provide an improved surface acoustic wave filter, containing one or more channels.

Another object of the present invention is to provide a surface acoustic wave filter that utilizes periodic grating filters which are relatively insensitive to defects, have a relatively large periodicity for ease of fabrication, and which do not transmit transducer-generated spurious signals such as bulk waves.

Still another object of the present invention is to provide a surface acoustic wave filter wherein at least two sets of associated periodic grating filter arrays are utilized, each of the associated ones of the arrays of the different sets having a predetermined different frequencyselective characteristic for providing increased design flexibility.

Yet another object of the present invention is to provide a simplified, compact and economic, high yield surface acoustic wave filter that may be fabricated in a single step by such methods as photo-lithography or electron-beam lithography.

In accordance with one embodiment of the present invention, there is provided a surface acoustic wave filter wherein an input transducer is disposed on a substrate having a surface capable of supporting propagating surface acoustic wave energy, the input transducer converting electrical input energy to surface acoustic wave energy in the substrate propagating along a first predetermined path. Also disposed on the substrate surface is a first set of spaced periodic grating filter arrays tandemly positioned in the first predetermined path, each for reflecting a portion of the propagating surface acoustic wave energy incident thereon along a separate predetermined intermediate path skew to the first predetermined path. A second set of periodic grating filter arrays is provided, each lying along a different one of the separate predetermined intermediate paths and each reflecting at least a portion of the propagating surface acoustic wave energy incident thereon along a separate predetermined output path skew to the associated intermediate path, each of the associated ones of the periodic grating filter arrays in the first and second sets having a predetermined different frequency-selective characteristic. Further, output transducers are provided each lying along a different one of the predetermined output paths, each converting surface acoustic wave energy incident thereon, as reflected by the associated ones of the periodic grating filter arrays in the first and second sets, to electrical output energy having a desired different center frequency.

The invention includes embodiments wherein there is only one periodic grating filter in each set, and wherein the periodic grating filter arrays are either rectangular or in a parallelepiped configuration.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawings, in which like reference characters refer to like elements in the several views.

BRIEF DESCRIPTION OF THE DRAWINGS:

FIG. 2 is a simplified illustration of a portion of a periodic grating filter array in accordance with the invention;

FIG. 4 is a simplified sectional view of three different types of reflectors;

FIG. 7 is a graphic representation of the output characteristics provided by the various filter arrangements shown in FIG. 6;

Figure 1:
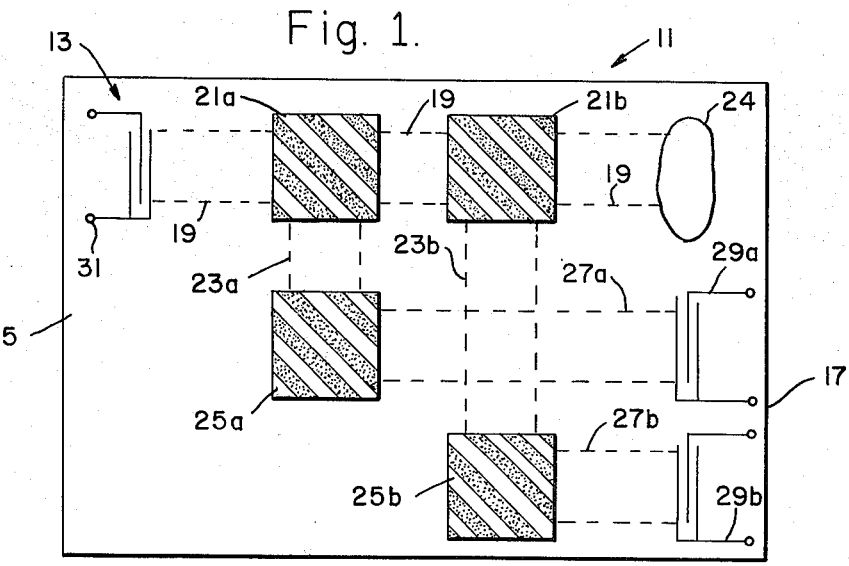
FIG. 1 is a plan view illustration of a surface acoustic wave multi-channel filter in accordance with an embodiment of the present invention.

DESCRIPTION OF THE PREFERRED EMBODIMENTS:

Referring now to the drawings and more particularly to the embodiment illustrated in FIG. 1, there is shown a surface acoustic wave multi-channel filter 11 with a relatively broad band input interdigital transducer 13 disposed on a surface 15 of a substrate 17, the surface being capable of supporting propagating surface acoustic wave energy. The input transducer 13 is of conventional design and adapted to convert electrical input energy to surface acoustic wave energy in the substrate and to propagate the energy along a first predetermined path 19.

Also disposed on the substrate surface 15 is a first set of spaced periodic grating filter arrays 21a and 21b tandemly positioned in the aforesaid first predetermined path 19. In this embodiment, the arrays 21a and 21b are rectangular in shape comprising a series of reflectors (impedance discontinuities), spaced at one wavelength (of the surface acoustic wave) intervals, from which incident surface acoustic wave energy is reflected into a desired predetermined intermediate direction 23a and 23b, respectively. On y-z LiNbO₃ and for right angle reflection paths, the grating element angle is approximately 46.8° with respect to the z-axis of the crystal. This particular angle was determined for an ion-etched groove array at Lincoln Laboratories and described in detail in an article by R. C. Williamson and H. I. Smith "Large-Time Bandwidth-Product Surface-Wave Pulse Compression Employing Reflective Gratings," in Electronic Letters, Vol. 8, No. 16, pages 401 and 402, Aug. 10, 1972. A portion of the array 21a is shown in FIG. 2.

A second set of periodic grating filter arrays 25a and 25b, each lying along a different one of the separate intermediate paths 23, each reflect at least a portion of the propagating surface acoustic wave energy incident thereon along a separate predetermined output path 27a and 27b skew to the associated intermediate paths 23a and 23b. Of importance is the fact that each of the associated ones of the periodic grating filter arrays in the first and second sets have a predetermined different frequency-selective characteristic.

Lying along a different one of the output paths 27a and 27b are output transducers 29a and 29b, respectively, for converting surface acoustic wave energy incident thereon, as reflected by the associated ones of the periodic grating filter arrays in the first and second sets, to electrical output energy having a desired different center frequency.

In operation, an electrical input signal is coupled to terminal 31 of the broad band input transducer 13 where it is converted to a surface acoustic wave propagating along the first predetermined path identified generally by dashed lines 19 in FIG. 1. As noted previously, a portion of this propagating energy is reflected into separate intermediate paths 23 by each of the periodic grating arrays 21 in the first set of such arrays, and any energy still remaining after propagating through the last of the arrays in the first set is preferably totally absorbed by any conventional surface acoustic wave termination 24, such as black wax or an ion-etched absorption area, for example.

Energy reflected into the aforementioned intermediate paths is again reflected by an associated one of the grating filter arrays 25 of the second set so as to follow an output path 27 toward one of the output transducers 29. Here, the surface acoustic wave energy, as selectively filtered by the combined frequency-selective characteristic of the periodic grating filter arrays, is converted into electrical energy. The filtration action relationship between an input electrical signal and output signals from a multi-channel filter constructed in accordance with the present invention is illustrated clearly in a second embodiment shown in FIG. 3.

Figure 3:
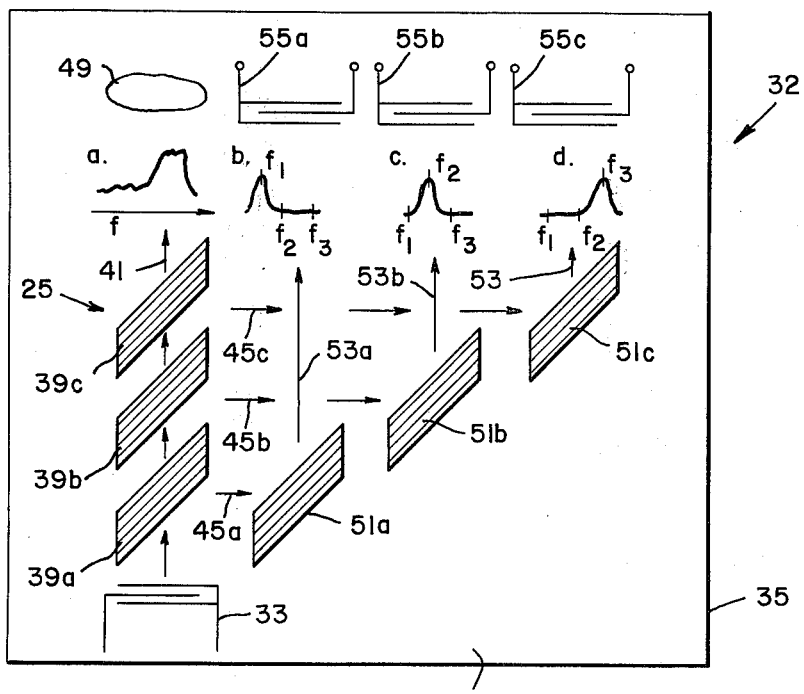
FIG. 3 is a schematic plan view illustration, including representative waveforms, of another embodiment of the invention.

Referring now to FIG. 3, there is shown a surface acoustic wave multi-channel filter 32 having a relatively broad band input transducer 33 disposed on a substrate 35 with a surface 37 capable of supporting propagating surface acoustic wave energy. Disposed also on the surface 37 are three spaced and tandemly-positioned periodic grating filter arrays 39a, 39b and 39c.

The three grating filter arrays lie on a first path 41 of the surface acoustic wave energy generated by the input transducer array 33, and are parallelepiped in shape. They are, however, similar in design and operation to the grating filter arrays 21 in the previously described embodiment of the invention. Thus, a portion of the energy incident on each of the arrays in the first set of periodic grating filter arrays 39 reflects energy to which it is "tuned" toward an associated one of a second set of periodic grating filter arrays 43 along intermediate paths 45, indicated by arrows. The energy not reflected along the intermediate paths is totally absorbed by a surface acoustic wave termination 49 also lying in the first path 41. The graphical illustration a in FIG. 3 generally indicates that portion of wideband input signal energy that is absorbed by the termination 49 after the propagating energy passes through the first set of periodic grating filter arrays.

As in the first embodiment, a second set of periodic grating filter arrays 51, each having a predetermined different frequency-selective characteristic, is disposed on the substrate surface 37, respectively along a different one of the intermediate paths 45 to intercept and reflect, along an output path 53, at least a portion of the propagating surface acoustic wave energy incident thereon toward an associated output transducer array 55 disposed on a different one of the output paths 53. The graphical representations, b, c, and d in FIG. 3 illustrate three different pass bands provided by the filter 32 at the three spatially-separated output transducers 55.

The input and output transducers described in all the various embodiments of the invention are of conventional design and may have a relatively broad band response. These transducers may have any desired number of interdigitated electrodes, as well known to those skilled in the art, and they may be formed by any conventional process using any suitable electrical conductive material, such as but not limited to aluminum or gold, for example. For a more detailed description of the theory and construction of these devices and the surface acoustic wave art generally, reference may be made to articles on the subject such as, for example, an article entitled "Surface Electric Waves" by Richard M. White, in the Proceedings of the IEEE, Vol. 58, No. 8, Aug. 1970.

FIG. 4 illustrates three different periodic grating filter array configurations that may be utilized in fabricating any of the embodiments of the invention. FIG. 4a shows an array having a relatively thin-film aluminum metallization 57, 1500 A thick ($t_1$) and produces periodic electric-field shorting on a Y-cut, Z-propagating LiNbO$_3$ crystal plate (substrate 17'). A relatively thick ($t_2$) film 59 of gold may alternately be provided as an elastic discontinuity on a non-piezoelectric substrate 17'', such as Y-cut quartz, for example (see FIG. 4b). The configuration shown in FIG. 4c is still another possible manner in which to provide the desired impedance discontinuity. Here, an ion-etched groove grating 61 is provided on any dielectric substrate 17''' having a surface acoustic wave-propagating surface 15'. The three illustrated grating array configurations exhibit different bandwidths, respectively from greatest to smallest, that may be chosen depending on a design basis. Again, the grating array shape may be either parallelepiped or rectangular. Generally similar characteristics of these two grating array shapes have been empirically confirmed and are illustrated graphically in FIG. 5 by the normalized bandwidth of a periodic grating filter for the two geometries. The experimental background for the data used in plotting this graph will be discussed in more detail hereinafter.

As noted previously, the narrow-bandpass multichannel filter utilizing periodic grating filter array ensembles has the advantage of a grating periodicity approximately 50 percent larger than the equivalent interdigital transducer, and three times larger than one containing double electrodes, thus alleviating the lithography limitation at high frequencies.

Figure 6:
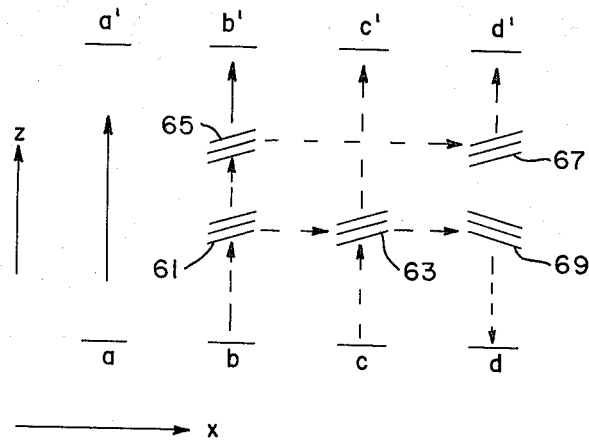
FIG. 6 illustrates, schematically, various possible surface acoustic wave filter arrangements in accordance with the present invention.

FIG. 6 illustrates, in a schematic representation, several surface acoustic wave arrangements, each having a different propagation path. These arrangements were designed to operate in the 100 MHz frequency range, and utilize standard interdigital launching and receiving transducers with approximately 20 percent bandwith. The pass band of the periodic grating filters is much smaller than that of the transducers, and is obtained by Bragg reflection to produce, in some embodiments of the invention, a 90° angle in each of the two grating filter array ensembles as a result of the grating elements forming an angle of 46.8° (see FIG. 2), for the z-axis of a y-cut LiNbO$_3$ crystal plate. The bandwidth of the grating filter arrays depends on the length and width of the arrays, as well as on their positions. Two of the three reflected signal paths shown in FIG. 6 are along z, x and z (the third being along the z, x, −z), and each of the grating filter arrays contains 80 reflecting elements of equal stripwidth and gapwidth, and each is 36 wavelengths wide.

In fabrication of the device of FIG. 6, 4-period interdigital transducers ($a$-$a'$, $b$-$b'$, $c$-$c'$, and $d$-$d'$) with one 1500 A aluminum metallization were used. The effect of a grating array in the path of a delay line is shown in FIG. 7 as path $c$-$c'$, and it is to be compared with the frequency response of the reference path $a$-$a'$. The latter has a tuned insertion loss of 10 db at the band center (102 MHz), and it is seen that the array produces a notch 5 db deep and centered at that frequency. Thus, 32 percent (5 db) of the incident energy is reflected out of the pass, and, in the absence of losses, 68 percent (1.7 db) is transmitted at rightangles.

As to the frequency response of the two periodic grating ensembles 61, 63, and 65, 67 defining z-shaped paths $b$-$c'$ and $b$-$d'$, respectively, these grating pairs were designed to have periodicities that differ by approximately 2 percent which causes the shift in frequency response shown in FIG. 7. The 3 db bandwidth of each of these responses is about 0.8 percent. Where another periodic grating filter (69) similar in construction to the other filter is provided, a U-shaped path $c$-$d$ is defined which has a frequency response substantially narrower (approximately one-third than that of the z-shaped path $b$-$c'$.

As noted previously, rectangular and parallelogram-type arrays have been studied in this application. The frequency response of the parallelogram-type array may be determined from an impulse-response model. Assuming that the attenuation of the transmitted wave through the array is negligible, and using $\sin \theta \simeq \theta$, the amplitude-reflection coefficient for the U-path ($c$-$d$) and the Z-path ($b$-$c'$) reflections are $$R^U = r^2 NM \left\{ \mathrm{sinc}\, N\theta \left( \mathrm{sinc}\, \frac{M\theta}{2} \right)^2 - 2\, \frac{M}{N} \cos N\theta \, \frac{1-\mathrm{sinc}\, M\theta}{(M\theta)^2} \right\}$$

and $$R^Z = r^2 NM \left\{ \left( \mathrm{sinc}\, \frac{M\theta^2}{2} \right) - 2\, \frac{M}{N} \, \frac{1-\mathrm{sinc}\, M\theta}{(M\theta)^2} \right\}$$

where $$\theta = 2\pi \left( \frac{f}{f_o} - 1 \right)$$

$$\mathrm{sinc}\, x = \frac{\sin x}{x}$$

N and M are numbers of reflectors along the length and width of the array, respectively, $r$ is the single-element reflection coefficient, $f$ is the operating frequency, and $f_o$ is the synchronous frequency of the array. The corresponding formulas for filled-in rectangular arrays retain only the first terms in the braces.

Figure 5:
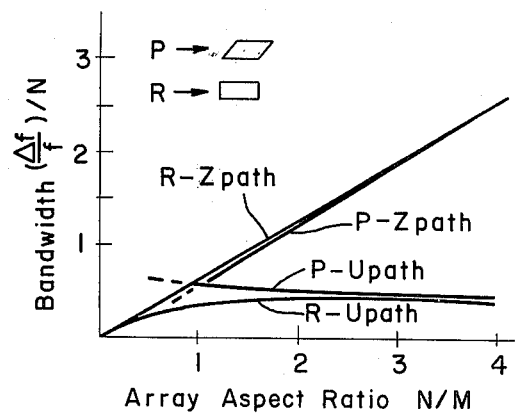
FIG. 5 graphically illustrates the normalized bandwidth of a periodic grating filter for four geometries.

When N is $\geq$ M, the bandwidth of the U-path reflection is determined primarily by the array length N, whereas that for the Z path reflection is determined by the bandwidth M. This is shown in FIG. 5, which compares the experimental device with the theory. The broader experimental bandwidth rises from a slight saturation of the frequency response, owing to multiple reflections. At synchronism ($\theta=0$), the magnitude of the reflection is $NMr^2$ for the rectangular arrays and $N'Mr^2$ for parallelogram arrays, where $N' = N - M/3$. The factor $N'$ for the parallelogram arrays is approximately the effective array length, as it determines the location of some of the zeros in the array passband, in much the same way that N does for rectangular arrays. The zeros in the frequency response for the experimental U-path (c-d) reflections are accurately predicted by the factor $N'$ ($N = 80 - 36/3 = 68$). The asymmetry in the frequency response is attributed primarily to wavefront distortions.

Figure 8:
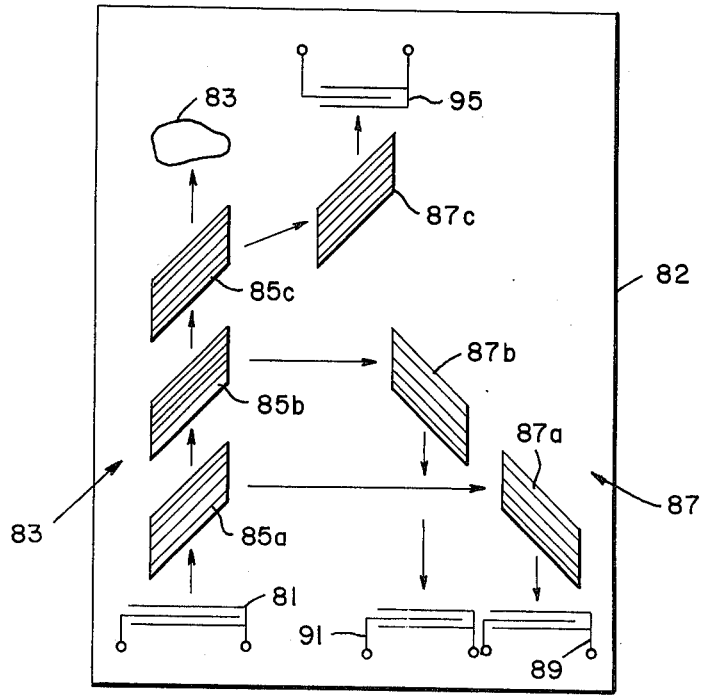
FIG. 8 illustrates still another embodiment of the present invention.

Referring now to FIG. 8, there is shown still another embodiment of the present invention. Here, an input transducer 81 is disposed on an appropriate substrate 82 and generates a surface acoustic wave toward an acoustic absorber element 83. As in previously described embodiments, energy not reflected by a first set 85 of tandemly-disposed periodic grating filters 85a, 85b, 85c toward associated ones of such gratings 87a, 87b, 87c of a second set 87, is absorbed by the absorber element 83.

In this embodiment, there are two U-shaped paths. The first is defined by the input transducer 81, the first periodic grating filter 85a of the first set 85, the first periodic grating filter 87a of the second set 87, and a first output transducer 89. The second path is defined by the transducer 81, the gratings 85b and 87b, and a second output transducer 91. A third path has a modified Z shape. Energy propagating through the first two gratings 85a and 85b is reflected at other than a right angle to an associated grating filter 87c in the second set 87 of periodic filters where the energy is in turn reflected toward a third output transducer 95 where the energy is converted into electrical output energy having a desired different center frequency.

Figure 9:
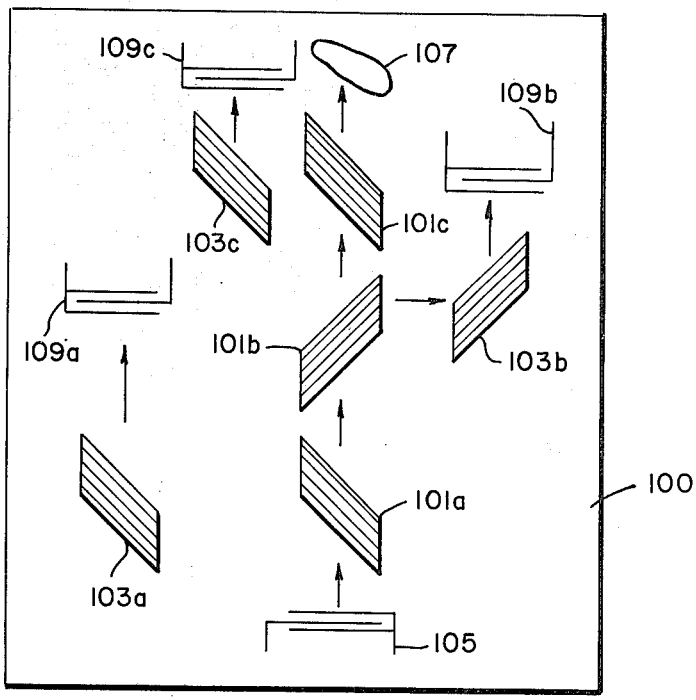
FIG. 9 is a plan view schematically illustrating yet a further embodiment of the present invention.

Yet another version of the basic configuration described in FIG. 1 is illustrated in FIG. 9. Again, all components are mounted on a surface acoustic wave-supporting substrate, such as substrate 100, for example, and the periodic grating filters may be of a desired shape. The first set of such filters is designated 101a through c, and the second set of such filters is designated 103a through c.

It will be noted that surface acoustic wave energy generated by a broadband input transducer 105 propagates through the three gratings of the first set before being absorbed by a conventional acoustic energy absorber 107, and that adjacent ones of these filters reflect a portion of the energy incident thereon in opposite directions. For example, energy is reflected to the left toward the periodic grating filters 103a and 103c respectively, by the first and third filters 101a and 101c and to the right toward a periodic grating filter 103b by the second filter 101b. Each of the filters 103 in turn reflect propagating surface acoustic wave energy incident thereon toward respective associated output transducers 109a, b, and c, where such energy is transformed into electrical signals evidencing frequency-selective filtering as brought about by the periodic grating filters.

From the foregoing, it should be evident that there has herein been described an improved surface acoustic wave filter having one or more channels which utilizes periodic grating filter arrays that are relatively insensitive to defects, have relatively high periodicity for ease of fabrication, and which do not transmit transducer-generated spurious signals such as bulk waves.

Although the present invention has been shown and described with reference to particular embodiments, nevertheless, various changes and modifications obvious to a person skilled in the art to which the invention pertains are deemed to lie within the spirit, scope, and contemplation of the invention.

What is claimed is:

1. A surface acoustic wave multi-channel filter, comprising:
   a substrate having a surface capable of supporting propagating surface acoustic wave energy;
   input transducer means disposed on said substrate surface for converting electrical input energy to surface acoustic wave energy in said substrate and propagating said energy along a first predetermined path;
   periodic grating filter means disposed on said substrate and including a first set of spaced periodic grating filter arrays tandemly positioned in said first predetermined path each for reflecting a portion of the propagating surface acoustic wave energy incident thereon along a separate predetermined intermediate path skew to said first predetermined path, and also including a second set of periodic grating filter arrays each lying along a different one of said separate predetermined intermediate paths and each reflecting at least a portion of the propagating surface acoustic wave energy incident thereon along a separate predetermined output path skew to the associated intermediate path, each of said periodic grating filter arrays including a plurality of spaced parallel reflector elements having a fixed periodicity, said periodic grating filter arrays in each associated pair of such arrays having the same reflector element periodicity but different from the reflector element periodicity of other associated pairs of such arrays thereby providing a predetermined different frequency-selective characteristic for each said associated pairs of said periodic grating filter arrays; and
   output transducer means disposed on said substrate surface and including output transducers each lying along a different one of said predetermined output paths and each converting surface acoustic wave energy incident thereon, as reflected by said associated pairs of said periodic grating filter arrays in said first and second sets, to electrical output energy having a desired different center frequency.

2. The filter according to claim 1, wherein said periodic grating filters include elements one-half wavelength wide and spaced one wavelength apart.

3. The filter according to claim 2, wherein said substrate is a piezoelectric material, and wherein said reflector elements are relatively thin metallizations.

4. The filter according to claim 2, wherein said substrate is a non-piezoelectric material, and wherein said reflector elements are relatively thick metallizations.

5. The filter according to claim 2, wherein said substrate is a piezoelectric material, and wherein said reflector elements are grooves in said surface of said substrate.

6. The filter according to claim 1, wherein said input transducer means, said associated pairs of said periodic grating filter arrays and the output transducers associated therewith generally define Z-shaped paths.

7. The filter according to claim 1, wherein said input transducer means, said associated pairs of said periodic grating filter arrays and the output transducers associated therewith generally define U-shaped paths.

* * * * *